United States Patent
Nuttgens

(10) Patent No.: US 11,177,773 B1
(45) Date of Patent: Nov. 16, 2021

(54) TRANSIMPEDANCE AMPLIFIERS

(71) Applicant: Semtech Corporation, Camarillo, CA (US)

(72) Inventor: Jonah Edward Nuttgens, Ashurst (GB)

(73) Assignee: SEMTECH CORPORATION, Camarillo, CA (US)

( * ) Notice: Subject to any disclaimer, the term of this patent is extended or adjusted under 35 U.S.C. 154(b) by 0 days.

(21) Appl. No.: 16/947,190

(22) Filed: Jul. 22, 2020

(51) Int. Cl.
*H03F 1/02* (2006.01)
*H03F 3/45* (2006.01)
*H04B 10/69* (2013.01)

(52) U.S. Cl.
CPC ....... *H03F 1/0205* (2013.01); *H03F 3/45269* (2013.01); *H04B 10/69* (2013.01); *H03F 2200/36* (2013.01); *H03F 2200/372* (2013.01)

(58) Field of Classification Search
CPC .................................................... H03F 1/0205
See application file for complete search history.

(56) References Cited

U.S. PATENT DOCUMENTS

| | | | | |
|---|---|---|---|---|
| 6,809,591 B1* | 10/2004 | Ohashi | ................. | H03G 3/3036 330/254 |
| 9,748,908 B1* | 8/2017 | Tan | ............................ | H03F 1/34 |
| 2006/0104647 A1* | 5/2006 | Schrodinger | ........ | H04B 10/693 398/202 |
| 2011/0050341 A1* | 3/2011 | Khoury | ................. | H03F 3/3061 330/253 |
| 2012/0264391 A1* | 10/2012 | Basaran | ................... | H03F 3/193 455/341 |
| 2013/0207723 A1* | 8/2013 | Chen | .................... | H03F 3/45475 330/260 |
| 2018/0337732 A1* | 11/2018 | Ogata | ................... | H04B 10/808 |
| 2019/0123691 A1* | 4/2019 | Puttananjegowda | .. | G01N 33/49 |

* cited by examiner

*Primary Examiner* — Patricia T Nguyen
(74) *Attorney, Agent, or Firm* — Alston & Bird LLP

(57) ABSTRACT

The application describes a transimpedance amplifier circuit having a first circuit branch extending between first and second supply nodes. An input NMOS transistor is located in the first circuit branch, with its drain terminal coupled to the first supply node via a load resistor, its source terminal coupled to the second supply node and its gate terminal coupled to an input node for receiving an input signal. The circuit includes a PMOS transistor having its source terminal coupled to a third supply node, its drain terminal coupled to the first circuit branch, at a node in a part of the first circuit branch extending from the drain terminal of the input transistor to the load resistor, and its gate terminal coupled to the input node. A drain current of the PMOS transistor contributes a proportion but not all of a drain current for input NMOS transistor.

20 Claims, 4 Drawing Sheets

US 11,177,773 B1

TRANSIMPEDANCE AMPLIFIERS

FIELD OF THE INVENTION

This disclosure relates to methods and apparatus pertaining to or concerning transimpedance amplifiers, and methods of operation thereof, and in particular to amplifier circuitry suitable for an input stage for transimpedance amplifiers.

DESCRIPTION OF THE RELATED TECHNOLOGY

Transimpedance amplifiers (TIAs) are useful for a variety of applications. In particular, an optical communications receiver, for receiving data transmitted in optical form, may comprise a photodetector arranged to receive the optical signal and output a corresponding photocurrent, and a TIA for receiving the photocurrent. For such a TIA, the gain, bandwidth, noise and power consumption may be important considerations and these parameters are typically influenced by the performance of an input stage of the TIA. The design of an input stage of a TIA may typically involve trade-offs between these parameters, for example, adjustments to improve bandwidth may result in an undesirable increase in noise or power consumption.

FIG. 1 illustrates an example of a conventional architecture of a CMOS TIA input stage 100, in this case for an optical receiver. FIG. 1 illustrates that the input stage 100 comprises an inverting amplifier 101, with gain −A and a feedback resistor $R_{FB}$, arranged to form a feedback loop. Optionally, a non-inverting buffer 102, for example a source-follower, may be included to buffer the load of the feedback resistor from the inverting amplifier output, and may also provide a voltage level-shifting function. The output, TZOUT, of the TIA input stage 100 may be taken from the input or output side of the buffer, if present.

In an implementation as part of an optical receiver, a photodiode 103 may be configured to generate a photocurrent $I_{IN}$ in response to a received optical signal, and the photocurrent $I_{IN}$ may be received as an input to the input stage 100 via an input node 104. FIG. 1 illustrates that the input will have some associated inherent input capacitance $C_{IN}$, for instance contributions from the capacitance of the photodiode 103, the input capacitance of the inverting amplifier 101, parasitic capacitances, and the capacitances associated directly with the input terminal 104 such as a wire-bond pad and any ESD protection devices.

The closed-loop operation of the input stage 100 causes any variations of the input signal current $I_{IN}$ to be counteracted by a substantially equal variation in the current through the feedback resistor $R_{FB}$. The resulting variation in voltage across $R_{FB}$ appears as a signal voltage at the output of the amplifier. Assuming that buffer has approximately unity gain and that the magnitude of A is >>1, then the transimpedance gain of the input stage ($dV_{TZOUT}/dI_{IN}$) is approximately equal to $-R_{FB}$.

The output TZOUT of the TIA input stage 100 may be subsequently fed to further processing stages 105, for example to convert the single-ended output from the TIA first stage into a differential signal; to provide additional gain; to apply frequency response equalization or filtering; and/or to drive a low-impedance transmission line output.

The overall performance of the TIA is heavily dependent on the performance of the inverting amplifier 101. The input impedance of the TIA (assuming that the buffer 102 has unity gain) is approximately equal to $R_{FB}/(1+A)$. The bandwidth of the TIA input stage is often dominated by the time-constant formed by the product of the TIA input impedance and the input capacitance $C_{IN}$. In general, the lower the input impedance $R_{FB}/(1+A)$, the greater the bandwidth of the TIA input stage 100. The bandwidth could therefore be increased by using a lower value for the resistance of the feedback resistor $R_{FB}$, but this would come at the expense of reduced transimpedance gain and increased noise. For these reasons it is generally preferable to make $R_{FB}$ as large as possible; therefore, it is desirable to increase the magnitude of the voltage gain A of the inverting amplifier 101.

SUMMARY

Embodiments of the present disclosure provide TIA input stages, and methods relating thereto, that may offer performance benefits compared to conventional input stages. At least some embodiments relate to TIA input stages which provides improvements in one or more of the parameters of gain, bandwidth, noise and power consumption.

Thus, according to an aspect of the present disclosure, there is provided a transimpedance amplifier comprising a first circuit branch extending between first and second supply nodes. An input NMOS transistor is located in the first circuit branch, the input transistor having a drain terminal coupled to the first supply node via a load resistor, a source terminal coupled to the second supply node and a gate terminal coupled to an input node for receiving an input signal. The transimpedance amplifier also comprises a PMOS transistor having a source terminal coupled to a third supply node, a drain terminal coupled to the first circuit branch at a node in a part of the first circuit branch extending from the drain terminal of the input transistor to the load resistor, and a gate terminal coupled to said input node. In use, a drain current of the PMOS transistor contributes a proportion, but not all, of a drain current for input NMOS transistor.

In some examples the gate terminal of the PMOS transistor may be coupled directly to the input node. In some examples the gate terminal of the PMOS transistor may be coupled to the input node via a capacitor. In some examples the gate terminal of the PMOS transistor may be coupled to the input node via a buffer.

In some examples, in use, a voltage at the third supply node may have a lower magnitude than a voltage at the first supply node. In some examples the second supply node may be a ground node.

The transimpedance amplifier may comprise a supply generator configured to provide a supply current to the third supply node. In some examples the supply generator may be configured such that at least part of the supply current for the third supply node also forms at least part of a supply current for powering another circuit block. The supply generator may, in some examples, comprise a pass transistor for passing said supply current to the third supply node and a regulator for controlling the pass transistor to maintain a voltage of the third supply node equal to a reference voltage, wherein the pass transistor is coupled in series between said other circuit block and the third supply node. In some examples the supply generator may comprise a current mirror having an input current branch for supplying a defined current to the third supply node and at least one output current branch for supplying a scaled current, where the at least one output current branch is between said other circuit block and the third supply node. In some examples the other circuit block, also powered by the supply current for the third supply node, comprises at least part of a stage of the transimpedance amplifier downstream of the first circuit branch.

The transimpedance amplifier may, in some examples, further comprise at least one cascode NMOS transistor in the first circuit branch. The transimpedance amplifier may further comprise at least one supplemental current generator for supplying a fixed supplemental current to a node of the first circuit branch between the drain terminal of the input transistor and the load resistor.

The first circuit branch may be configured as at least part of an inverting amplifier of an input stage of the transimpedance amplifier. The transimpedance amplifier may further comprise a feedback path from an output of the inverting amplifier to the input node via a feedback resistor.

The transimpedance amplifier may, in some examples, be implemented as part of an optical receiver comprising a photodetector coupled to said input node.

In another aspect there is provided an amplifier circuit for an input stage of a transimpedance amplifier, the amplifier circuit comprising an input NMOS transistor having a gate terminal controlled based on an input signal to develop a drain current that varies with the input signal; and a PMOS transistor configured to generate a PMOS current which provides part of the drain current for the input NMOS transistor. The PMOS transistor is configured so that the PMOS current varies with the input signal.

In some examples of this aspect, at least part of supply current for the PMOS transistor also forms at least part of a supply current for powering at least one other circuit component.

In a further aspect there is provided a transimpedance amplifier circuit comprising a first circuit branch comprising a load resistor and an input transistor configured as a common-source amplifier for an input signal. A PMOS transistor is configured to inject a PMOS current into the first circuit branch at a node between the input transistor and the load resistor, wherein the PMOS current varies with the input signal.

In some example of this aspect the first circuit branch may further comprise at least one cascode transistor between the input transistor and the load resistor.

In some examples a gate of the PMOS transistor may be coupled to an input node for the input signal via one of: a direct coupling; a capacitive coupling; or a buffer.

It should be noted that any of the features of any of the embodiments or aspects of the disclosure described herein may be implemented in combination with any one or more of the other features, unless expressly indicated otherwise or otherwise inherently incompatible.

BRIEF DESCRIPTION OF THE DRAWINGS

To better explain various embodiments and examples of the present disclosure and the principles, example implementation and operation thereof, reference will be made, by way of example only, to the accompanying drawings, of which.

DETAILED DESCRIPTION

As discussed above with respect to FIG. 1, the performance of a TIA (transimpedance amplifier) input stage may depend, relatively significantly, on that of the inverting amplifier.

Figure 1:
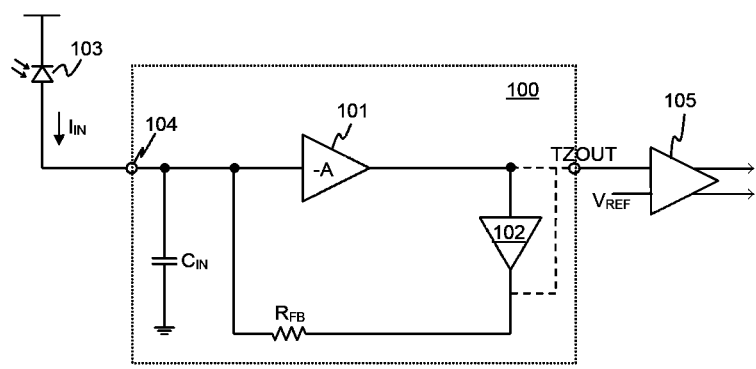
FIG. 1 illustrates the architecture of a conventional TIA input stage arranged as part of an optical receiver.
Figure 2A:
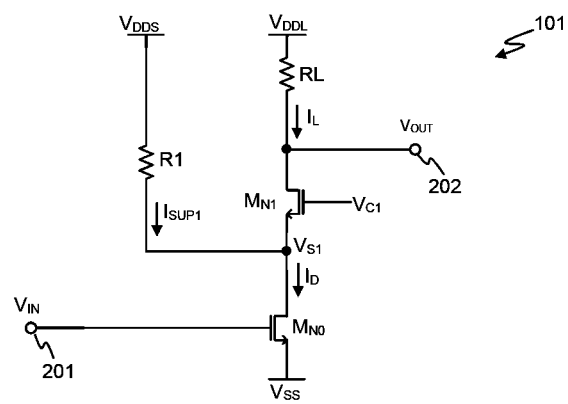
FIGS. 2*a* and 2*b* illustrate examples of conventional amplifiers for an input stage of a TIA.

FIG. 2*a* shows one example of a conventional implementation of an inverting amplifier 101 that may be employed in a TIA input stage 100 such as described with reference to FIG. 1. The amplifier 101 has an input node 201 for receiving an input voltage $V_{IN}$, and an output node 202 for outputting and output voltage $V_{OUT}$. A transistor $M_{N0}$ is configured as a common-source amplifier. The input transistor $M_{N0}$ is thus configured in a first circuit branch with its source terminal coupled to a negative supply node or rail $V_{SS}$, for example ground and its gate terminal coupled to the amplifier input node 201. The first circuit branch also includes a load resistor $R_L$ connected to a positive node or supply rail $V_{DDL}$ on the drain terminal side of the input transistor, and the amplifier output node couples to the first circuit branch between the load resistor $R_L$ and the input transistor $M_{N0}$.

Such a common-source amplifier would, to a simplistic first approximation, have a voltage gain given by $A=-g_m(M_{N0})*R_L$. However, this simplification neglects the effect of MOS output resistance ($r_{ds}$), which reduces the gain of the amplifier. The conventional solution to this issue is to cascode the amplifier with the addition of transistor $M_{N1}$ in series with the drain of $M_{N0}$ in the first circuit branch, with the gate of the cascode transistor $M_{N1}$ driven from voltage $V_{C1}$. $V_{C1}$ may be a constant voltage or may be variable; for example, a circuit may sense a voltage at $V_{S1}$, and control $V_{C1}$ in order to regulate the former. Typically the input transistor $M_{N0}$ and the cascode transistor $M_{N1}$ are implemented as NMOS devices due to their greater intrinsic performance, such as a higher transconductance for a given operating current and width/length ratio, compared to PMOS devices.

Figure 2B:
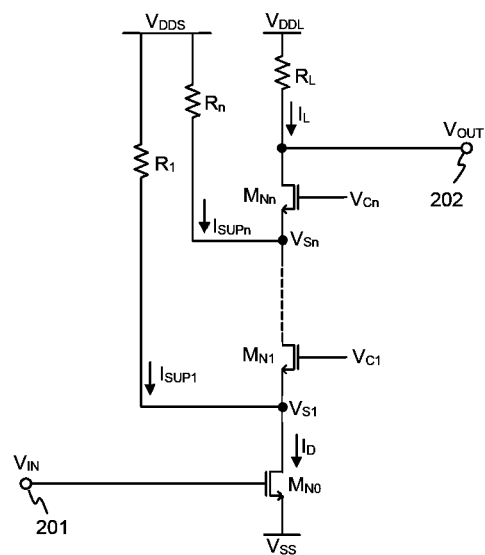

For some small-geometry CMOS processes in which the $r_{ds}$ of MOS transistors is particularly low, it may be desirable to employ more than one cascode stage, as shown in FIG. 2*b*, in which the amplifier is illustrated as including 1 to n cascode stages, in order to achieve a desired magnitude of voltage gain A of the amplifier. Thus there may be a plurality of cascode transistors in series with the input transistor in the first circuit branch.

It will be understood that magnitude of the voltage gain A could be increased simply by increasing $R_L$. However, a larger value of $R_L$ reduces the open-loop bandwidth of the inverting amplifier, due to the various load capacitances on $V_{OUT}$. A sufficient open-loop bandwidth is important to ensure the stability and favourable frequency response of the feedback loop, closed via $R_{FB}$ as discussed with reference to FIG. 1. For any chosen value of $R_L$, constrained by the open-loop bandwidth requirement, it is beneficial to make the voltage of the supply rail $V_{DDL}$ as high as possible. This maximizes the DC component of current $I_L$ and therefore the drain current $I_D$ of $M_{N0}$, in turn maximizing its achievable transconductance $g_m$, which improves the voltage gain A of the amplifier.

In the examples of FIGS. 2a and 2b, the DC component drain current $I_D$, and therefore transconductance $g_m$, of the input NMOS transistor $M_{N0}$ is increased by the addition of a supplemental bias current, consisting of the sum of $I_{SUP1} \ldots I_{SUPn}$, which may be applied to the first circuit branch at any or all of the cascode source nodes $V_{S1} \ldots V_{Sn}$. In such an arrangement, $I_D$ is equal to the sum of $I_L$ plus the total of any supplemental bias current(s) $I_{SUP1} \ldots I_{SUPn}$. The supplemental bias current may be supplied via resistors $R_1 \ldots R_n$ from positive supply rail $V_{DDS}$ (which may be the same as $V_{DDL}$).

The resistors $R_1 \ldots R_n$ place an unwanted load on the AC signal present at cascode source nodes $V_{S1} \ldots V_{Sn}$, which degrades the voltage gain A of the amplifier to some extent, however, the benefits of increased $I_D$ due to the addition of $I_{SUP1} \ldots I_{SUPn}$ can outweigh the detrimental loading effect of the resistors. In order to maximize the benefit, it is preferable to make $V_{DDS}$ as high as possible in order to maximize the value of resistors $R_1 \ldots R_n$, minimizing their loading effect, for any chosen values of $I_{SUP1} \ldots I_{SUPn}$. It will be noted that the supplemental bias current could alternatively be supplied from a constant current source, although the output capacitance of a practical current source (for example using a PMOS current mirror) may make this option less desirable.

The application of the supplemental bias current $I_{SUP1} \ldots I_{SUPn}$ thus has benefits for the performance of the amplifier 101, but at the expense of increasing power consumption. In some implementations, the degree of improvement in performance achievable by the application of a supplemental bias current may be limited by constraints on power consumption, for example due to a supply current budget for the TIA input stage, in order to meet a particular specification for the maximum allowable total supply current, and therefore power consumption, of the TIA circuit or integrated circuit comprising the TIA.

Figure 3:
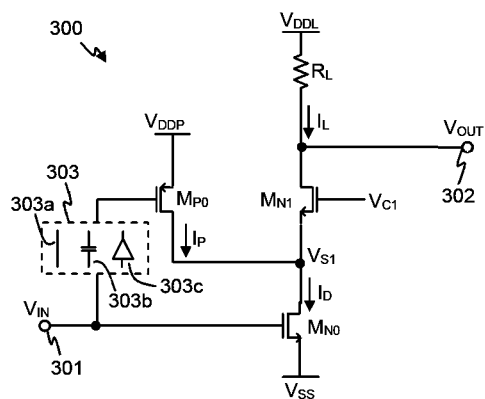
FIG. 3 illustrates an example of an amplifier according to an embodiment suitable for use as an input stage of a TIA.

FIG. 3 illustrates an amplifier 300 according to an embodiment, suitable for use as the inverting amplifier of a TIA input stage. The amplifier 300 includes an input node 301 for receiving the input voltage $V_{IN}$ and an output node 302 for outputting an output voltage $V_{OUT}$ and includes, in this example, an input transistor $M_{N0}$ and a cascode transistor $M_{N1}$ in a first circuit branch in a similar fashion as described with respect to FIGS. 2a and 2b. As described above, the input transistor $M_{N0}$ and cascode transistor $M_{N1}$ may be NMOS devices.

In the embodiment of FIG. 3, a PMOS transistor $M_{P0}$ is configured to provide a current $I_P$ which provides a contribution to the drain current of input transistor $M_{N0}$. However, unlike the supplementary currents $I_{SUP1}$-$I_{SUPn}$ discussed with reference to FIGS. 2a and 2b, which are generated with fixed nominal current values, i.e. so as to be substantially constant, the current $I_P$ from the PMOS transistor $M_{P0}$ is configured so as to vary with the input signal, i.e. to be modulated based on the PMOS transistor gate being coupled to $V_{IN}$.

Effectively, this enhances the gain of the amplifier, whose input transconductance becomes the sum of $g_m(M_{N0})+g_m(M_{P0})$. This increase in $g_m$ results in an improvement in the open-loop gain A of the inverting amplifier 300, compared to the examples of FIG. 2a or 2b, for the same total supply current. This, in turn, enables a beneficial increase in the gain-bandwidth product of the TIA input stage.

In the example of FIG. 3, the source of PMOS transistor $M_{P0}$ is thus connected to a positive supply node $V_{DDP}$ and its drain is coupled to a node of the first circuit branch, in this example cascode source node $V_{S1}$. In general, however, the drain of the PMOS transistor $M_{P0}$ could be connected to any node of a part of the first circuit branch that extends from the drain terminal of the input transistor $M_{N0}$ to the load resistor, which, for the avoidance of doubt, includes the drain terminal of the NMOS transistor $M_{N0}$. To provide a current $I_P$ that varies with input signal, the gate of $M_{P0}$ is coupled to the input node 301 so that the gate voltage of $M_{P0}$ has a dependence on the input voltage $V_{IN}$. The coupling 303 of the gate of $M_{P0}$ to the input node 301 may be implemented in a variety of ways, and FIG. 3 illustrates some examples of different couplings. In some implementations the gate of $M_{P0}$ could be directly coupled to the input node 301, e.g. via a suitable conductive path as illustrated by coupling 301a. In some implementations there may be a capacitive coupling, e.g. via a capacitor 303b, between the input node 301 and the gate of $M_{P0}$, which would allow the DC bias voltage of the gate of $M_{P0}$ to be freely defined, whilst allowing the gate voltage to vary with any variations in the input voltage. In some implementations there could be a coupling via a buffer 303c, which would alleviate the loading of the gate capacitance of $M_{P0}$ from the amplifier input node 301.

It should be noted that the current $I_P$ supplied to first circuit branch, in this case to the cascode source node $V_{S1}$, may be in addition to, or instead of, any fixed magnitude supplementary bias current(s) $I_{SUP1} \ldots I_{SUPn}$, (not shown in FIG. 3) such as described with reference to FIGS. 2a and 2b, which may be injected at the same and/or different nodes of the first circuit branch. Also, whilst FIG. 3 illustrates an example with a single cascode stage, i.e. n=1, in other implementations there may be additional cascode stages, i.e. there may be additional cascode transistors as part of the first circuit branch.

The DC drain current $I_D$ of $M_{N0}$ in the embodiment of FIG. 3 is equal to the sum of $I_P$ plus $I_L$, (plus, if applicable, any additional supplemental bias currents $I_{SUP1} \ldots I_{SUPn}$ applied to nodes of the first circuit branch). The PMOS drain current $I_P$ is configured to contribute a significant proportion of the total $M_{N0}$ drain current $I_D$, although substantially less than 100% of this drain current. For example, in one implementation the current $I_P$ supplied from the PMOS device may contribute at least 10% or more, or in some cases, at least 20% or more, say at least 50% or more, of the drain current $I_D$ for the input transistor. In some implementations the current $I_P$ supplied from the PMOS device may contribute at most 90%, or at most 80%, or in some cases at most 75% of the DC component of the drain current. It will be understood however that the relevant contribution may vary in different implementations and/or use cases.

As noted above, the use of an active PMOS device $M_{P0}$ in this way, can improve the gain of the amplifier for a given supply current budget compared to the conventional approach, which thus provides advantages in performance and/or power consumption.

Embodiments of the present disclosure thus relate to amplifiers suitable for use as the input stage for a TIA. Amplifiers according to embodiments comprise an input transistor, typically an NMOS device, connected in a first circuit branch, with the gate of input transistor driven by the input voltage and the drain of the input transistor coupled to a supply voltage via a load resistance. As noted the input transistor may be configured as at least part of a common-source amplifier. Amplifiers according to embodiments of the disclosure include a PMOS transistor configured to be driven with a gate voltage that varies in dependence on the input signal so as to provide a PMOS current which is injected to the first circuit branch so as to provide part of the drain current for the input transistor, and to contribute to the transconductance that substantially determines the amplifying ability of the circuit. As discussed above, conventional circuit designs tend to be architected to use predominantly or exclusively NMOS devices as the active gain elements along the critical high-speed signal path. Embodiments of the present disclosure incorporates a PMOS device in an active role, replacing or supplementing a bias current that would otherwise be supplied through a resistor or a constant current source. The addition of the PMOS device enables a higher total transconductance in the input stage of the TIA, for a given supply current, than would be possible with an NMOS device alone.

The use of the PMOS device in this way also provides opportunity for the re-use of a portion of the TIA input stage supply current for powering a separate block of circuitry, enabling a reduction in power consumption of the IC comprising the TIA as a whole.

In the embodiment of FIG. 3, there is no strong incentive to use a high voltage for the voltage $V_{DDP}$ of the supply node for the PMOS $M_{P0}$. This is in contrast to the supply node or rail $V_{DDL}$ for the first circuit branch and the supply node or rail $V_{DDS}$ for generating any supplemental current(s) $I_{SUP}$ which, as described above can benefit from being set to be as high as possible. For example, in the simple case where the source of $M_{N0}$ is grounded and the gate of $M_{P0}$ is directly connected to $V_{IN}$, the required voltage for the supply node $V_{DDP}$ for the PMOS $M_{P0}$ is simply equal to $V_{GS}(M_{N0})+V_{GS}(M_{P0})$. The supply node $V_{DDP}$ for the PMOS device $M_{P0}$ may thus have a voltage with a magnitude lower than that of the supply node $V_{DDL}$ for the circuit branch comprising the input transistor $M_{N0}$.

In some implementations, a supply voltage for the TIA circuit, e.g. an external supply voltage provided to the integrated circuit comprising the TIA, may be higher than the minimum voltage required for this supply node $V_{DDP}$, and in such cases the $V_{DDP}$ supply current may effectively be re-used by some other circuit block so as to avoid for the need for a separate supply current and hence provide power savings for the integrated circuit comprising the TIA.

Figure 4:
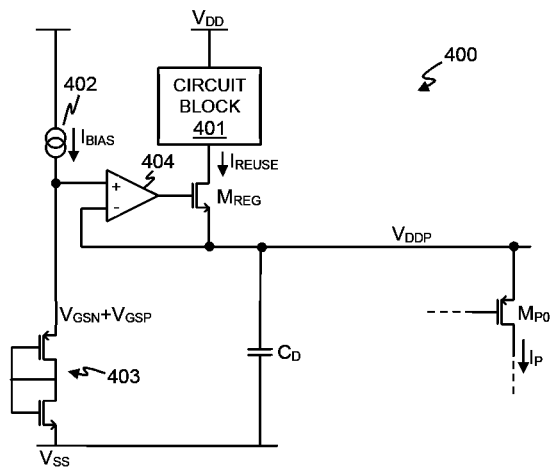
FIG. 4 illustrates one example of circuitry for providing a supply to the PMOS of the input stage in which the supply current is also used for powering another circuit block.

FIG. 4 shows an example of a circuit 400, e.g. a voltage regulator, for generating an appropriate voltage $V_{DDP}$ for the supply node for the PMOS $M_{P0}$ whilst using the relevant supply current for some other separate circuit block 401 or module.

FIG. 4 illustrates that a reference voltage $V_{GSN}+V_{GSP}$ is generated by dropping a bias current $I_{BIAS}$ generated by current source 402 through a series-connected pair of NMOS and PMOS transistors 403. The reference voltage is thus equal to the sum of the gate source voltage $V_{GSN}$ of the NMOS device and the gate source voltage $V_{GSP}$ of the PMOS device of the pair. The transistor pair 403 may comprise scaled replicas of $M_{N0}$ and $M_{P0}$, for example, biased at similar current densities. The reference voltage thus defines a suitable voltage for the supply rail $V_{DDP}$ for the PMOS $M_{P0}$.

An op-amp 404 drives the gate of a pass transistor $M_{REG}$, to regulate the voltage $V_{DDP}$ to be equal to the reference voltage. The AC components of the $M_{P0}$ load current are decoupled by capacitance $C_D$, so that the drain current $I_{REUSE}$ of the pass transistor $M_{REG}$ is nominally equal to the DC average of current $I_P$. This drain current $I_{REUSE}$ of the pass transistor is used in the negative supply current terminal of the separate circuit block 401, and thus this current is effectively re-used by the circuit block 401. This avoids the need for a separate supply currents for the circuit block 401 and the active PMOS device $M_{P0}$, which thus offers power savings for the circuit as a whole. Note that as used herein, the term 're-used' in respect to a current means that that a particular current component can be identified as flowing through a first circuit block, to be used to provide power, and that that current component can also be identified as flowing through a second circuit block where it is re-used to provide power. In other words, a defined current path can be identified that passes through two or more circuit blocks in series such that a current flowing along that defined current paths provides power for both circuit blocks. It should be noted the term re-use does not imply anything about the relative order in which the circuit blocks are connected with respect to any supply voltage. If a current component can be identified as flowing to provide power in a first circuit block and that current component also flows through a second identified circuit block, the current can be said to be re-used by the second circuit block, whether or not the second circuit block is connected upstream or downstream of the first circuit block.

It will be understood that reference voltages other than $V_{GSN}+V_{GSP}$ could equally be generated and used in such a circuit, for example for configurations where the PMOS transistor $M_{P0}$ requires different values of supply node voltage $V_{DDP}$.

Figure 5:
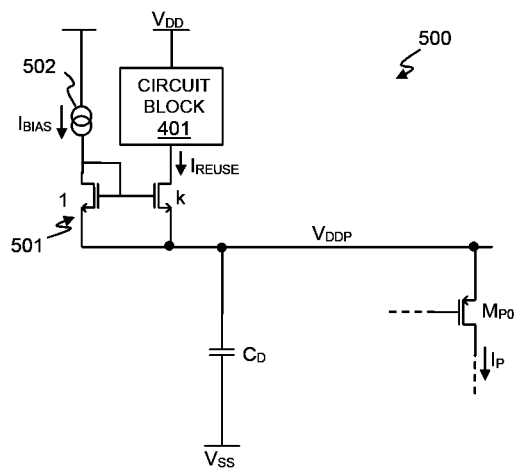
FIG. 5 illustrates another example of a supply generator that enables re-use of the supply current for the PMOS device.

FIG. 5 shows another example of a circuit 500, e.g. supply generator, for generating a suitable supply for the supply node $V_{DDP}$ for PMOS $M_{P0}$ whilst also using the supply current for a separate circuit block 401. In this example circuit 500, $V_{DDP}$ is supplied from a current mirror 501 with a ratio of 1:k, biased with a reference current laws from current source 502. The current mirror 501 generates a current $I_{REUSE}$ with a value equal to $k*I_{BIAS}$ at the negative supply terminal of the circuit block 401. Again a decoupling capacitor $C_D$ may decouple the AC components of the $M_{P0}$ load current, so the DC average of current $I_P$ becomes equal to $(1+k)*I_{BIAS}$. Thus at least a proportion of the current $I_P$ for the PMOS $M_{P0}$ is also as a supply current for the circuit block 401.

Note that FIG. 5 illustrates a single circuit block 401 being supplied with a single current $I_{REUSE}$. However the current mirror 501 could be arranged so that bias current $I_{BIAS}$, input to an 'input branch' of the current mirror is used to generate multiple scaled currents in different output branches, i.e. a first scaled current $I_{REUSE1}$ equal to $k_1*I_{BIAS}$ and a second scaled current $I_{REUSE2}$ equal to $k_2*I_{BIAS}$ etc. as would be understood by one skilled in the art. Some scaling factors, e.g. $k_1$ and $k_2$, could be the same as one another and/or at least some scaling factors could be different to one another, to provide the desired total combined current. The individual scaled current, e.g. $I_{REUSE1}$, $I_{REUSE2}$ etc. from the different output branches of the current mirror may be used for separately powering different components within a circuit block 401 and/or for powering different circuit blocks.

Figure 6:
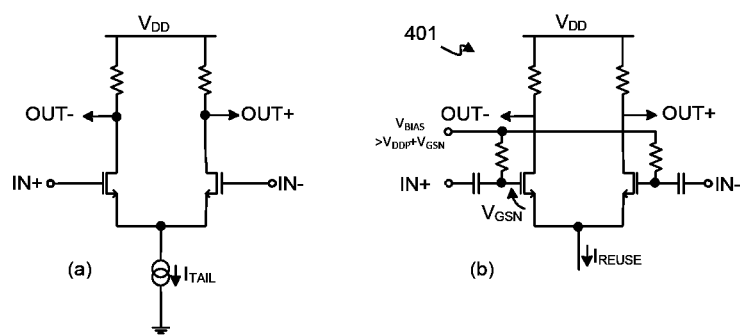
FIG. 6 illustrates an example of a circuit block that could be powered by such a re-use supply current.

FIG. 6 illustrates one example of a circuit block 401 that, with minor adaptation, could be suitably powered by re-using the supply current for the $V_{DDP}$ supply rail for PMOS $M_{P0}$, in this case a differential amplifier circuit, such as that which may be employed in the amplifier stages 105 that typically succeed the input stage 100 of a TIA.

FIG. 6a, on the left hand side, illustrates a conventional differential amplifier circuit that may be implemented, with respective input transistors connected in parallel and in series with a common current source for providing a defined tail current $I_{TAIL}$. FIG. 6b illustrates that the supply current $I_{REUSE}$ may be used to provide the tail current for the differential amplifier 401 and thus replace the conventional current source. In this case, the inputs to the differential amplifier may need to be AC-coupled and biased to a suitable DC reference voltage $V_{BIAS}$, higher than $V_{DDP}$ by a sufficient margin to ensure the correct biasing of the circuit, e.g. so as to ensure a sufficient gate-source voltage $V_{GSN}$ for the input transistors.

It should be noted that the circuit of FIG. 6 is just one example of a circuit block that could be configured (or slightly reconfigured) to make use of the current $I_{REUSE}$ and there are many other possible examples of circuit blocks that may be powered by $I_{REUSE}$. The supply current for any such circuit block is re-used to supply $V_{DDP}$ and therefore to form the DC component of PMOS drain current $I_P$. Since, as described above, $I_P$ is supplied to the first circuit branch of the amplifier of the TIA input stage, i.e. the NMOS device stack, in substitution for some or all of a supplementary current $I_{SUP1} \ldots I_{SUPn}$ that would conventionally be supplied, embodiments that re-use the current in this way save the supply current that would otherwise have been drawn independently from $V_{DDS}$, and ultimately from the IC power supply VDD. This aspect therefore enables a reduction in the total supply current of the IC comprising the TIA. In implementations where the power consumption is an important or limiting factor, constraining the design of a TIA IC, the supply current saved through such re-use of the current may be re-invested to improve other aspects of TIA performance, for example by increasing the total supplemental bias current in the TIA input stage.

Embodiments of the present disclosure thus provide amplifiers suitable for use for the input stage of a TIA that offer improvements in performance and/or power consumption compared to conventional implementations, through the use of an active PMOS device to supply a current which forms part of the drain current for an input transistor, where the current varies with the amplifier input. In some embodiments, at least part of the current supplied by the PMOS device may also be re-used in another part of the TIA circuit so as to save power.

Embodiments may be implemented as an integrated circuit. In some embodiments the TIA input stage may be implemented as part of an optical receiver. Embodiments may be incorporated in a host electronic device.

It will be understood that the examples and embodiments described above are given by way of example only and those skilled in the art will understand that modifications, variations, additions or alterations may be made to specific embodiments described, or alternative embodiments may be implemented, without departing from the scope of the appended claims.

It should be noted that as used herein, unless expressly stated otherwise, the word "comprising" does not exclude the presence of other elements or steps other than those listed, references to an element or feature in the singular does not exclude the possibility of a plurality of such elements or features, and that recitation of different features or elements in the appended claims does not necessarily imply separate components; a single component or unit may fulfil the function of several elements recited in a claim. Any reference signs in the appended claims shall not be construed so as to limit their scope.

The invention claimed is:

1. A transimpedance amplifier comprising:
a first circuit branch extending between first and second supply nodes;
an input NMOS transistor located in the first circuit branch, the input transistor having a drain terminal coupled to the first supply node via a load resistor, a source terminal coupled to the second supply node and a gate terminal coupled to an input node for receiving an input signal;
a PMOS transistor having a source terminal coupled to a third supply node, a drain terminal coupled to the first circuit branch at a node in a part of the first circuit branch extending from the drain terminal of the input transistor to the load resistor, and a gate terminal coupled to said input node;
wherein, in use, a drain current of the PMOS transistor contributes a proportion but not all of a drain current for input NMOS transistor.

2. The transimpedance amplifier of claim 1 wherein the gate terminal of the PMOS transistor is coupled directly to said input node.

3. The transimpedance amplifier of claim 1 wherein the gate terminal of the PMOS transistor is coupled to said input node via a capacitor.

4. The transimpedance amplifier of claim 1 wherein the gate terminal of the PMOS transistor is coupled to said input node via a buffer.

5. The transimpedance amplifier of claim 1 wherein, in use, a voltage at the third supply node has a lower magnitude than a voltage at the first supply node.

6. The transimpedance amplifier of claim 1 wherein the second supply node is a ground node.

7. The transimpedance amplifier of claim 1 comprising a supply generator configured to provide a supply current to the third supply node, wherein the supply generator is configured such that at least part of the supply current for the third supply node also forms at least part of a supply current for powering another circuit block.

8. The transimpedance amplifier of claim 7 wherein the supply generator comprises a pass transistor for passing said supply current to the third supply node and a regulator for controlling the pass transistor to maintain a voltage of the third supply node equal to a reference voltage, wherein the pass transistor is coupled in series between said other circuit block and the third supply node.

9. The transimpedance amplifier of claim 7 wherein the supply generator comprises a current mirror having an input current branch for supplying a defined current to the third supply node and at least one output current branch for supplying a scaled current, where the at least one output current branch is between said other circuit block and the third supply node.

10. The transimpedance amplifier of any of claim 7 wherein said other circuit block comprises at least part of a stage of the transimpedance amplifier downstream of the first circuit branch.

11. The transimpedance amplifier of claim 1 wherein the first circuit branch further comprises at least one cascode NMOS transistor.

12. The transimpedance amplifier of claim 1 further comprising at least one supplemental current generator for supplying a fixed supplemental current to a node of the first circuit branch between the drain terminal of the input transistor and the load resistor.

13. The transimpedance amplifier of claim 1 wherein the first circuit branch is configured as at least part of an inverting amplifier of an input stage of the transimpedance amplifier.

14. The transimpedance amplifier of claim 13 further comprising a feedback path from an output of the inverting amplifier to said input node via a feedback resistor.

15. The transimpedance amplifier of claim 1 wherein the transimpedance amplifier is implemented as part of an optical receiver comprising a photodetector coupled to said input node.

16. An amplifier circuit for an input stage of a transimpedance amplifier, the amplifier circuit comprising:
- an input NMOS transistor having a gate terminal controlled based on an input signal to develop a drain current that varies with the input signal; and
- a PMOS transistor configured to generate a PMOS current which provides part of the drain current for the input NMOS transistor;
- wherein the PMOS transistor is configured so that the PMOS current varies with the input signal.

17. The amplifier circuit of claim 16 wherein at least part of supply current for the PMOS transistor also forms at least part of a supply current for powering at least one other circuit component.

18. A transimpedance amplifier circuit comprising:
- a first circuit branch comprising a load resistor and an input transistor configured as a common-source amplifier for an input signal; and
- a PMOS transistor configured to inject a PMOS current into the first circuit branch at a node between the input transistor and the load resistor, wherein the PMOS current varies with the input signal.

19. The transimpedance amplifier circuit of claim 18 wherein the first circuit branch further comprises at least one cascode transistor between the input transistor and the load resistor.

20. The transimpedance amplifier circuit of claim 18 wherein a gate of the PMOS transistor is coupled to an input node for the input signal via one of: a direct coupling; a capacitive coupling; or a buffer.

* * * * *